(12) United States Patent
Bae

(10) Patent No.: US 7,648,870 B2
(45) Date of Patent: Jan. 19, 2010

(54) METHOD OF FORMING FUSE REGION IN SEMICONDUCTOR DAMASCENE PROCESS

(75) Inventor: Se Yeul Bae, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 385 days.

(21) Appl. No.: 11/616,270

(22) Filed: Dec. 26, 2006

(65) Prior Publication Data

US 2007/0148956 A1 Jun. 28, 2007

(30) Foreign Application Priority Data

Dec. 27, 2005 (KR) .................. 10-2005-0131010

(51) Int. Cl.
*H01L 21/8238* (2006.01)
(52) U.S. Cl. .............. 438/215; 438/132; 438/281; 438/333; 438/467; 257/529

(58) Field of Classification Search ......... 438/253–254, 438/396–397, 618–624, 132, 215, 281, 333, 438/467, 601; 257/529
See application file for complete search history.

(56) References Cited

U.S. PATENT DOCUMENTS 7,169,665 B2* 1/2007 Lin et al. ............... 438/253
2003/0116820 A1* 6/2003 Daubenspeck et al. ...... 257/529

\* cited by examiner

*Primary Examiner*—Dung A. Le
(74) *Attorney, Agent, or Firm*—Sherr & Vaughn, PLLC

(57) ABSTRACT

A method of forming a fuse region in a semiconductor damascene process in which a specific layer is formed to prevent corrosion and re-connection of a severed part of the fuse region to prevent malfunction. A first conductive layer is formed over a substrate and an interlayer dielectric layer is deposited over the first conductive layer. A second conductive layer is buried in the interlayer dielectric layer by a dual damascene process to simultaneously form an interconnection and a fuse. The resultant structure is coated with a passivation layer. The fuse is cut to form a severed portion. A selective metal layer is deposited over the severed portion.

13 Claims, 8 Drawing Sheets

METHOD OF FORMING FUSE REGION IN SEMICONDUCTOR DAMASCENE PROCESS

The present application claims priority under 35 U.S.C. 119 and 35 U.S.C. 365 to Korean Patent Application No. 10-2005-0131010 (filed on Dec. 27, 2005), which is hereby incorporated by reference in its entirety.

BACKGROUND

In general, as the semiconductor industry continuously progresses towards larger scale integrated circuits, the geometrical shape of device is continuously reduced, and circuit density increases to improve performance and reliability.

Because of this, thin layers of copper are used as a material for the metal interconnections in semiconductor devices. A copper wiring layer has a higher melting point than aluminum so that it presents higher resistance against electro-migration (EM), thereby improving the reliability of the semiconductor device. Copper has a low resistivity, allowing an increase the signal transmission speed. For these reasons copper wiring layers are used as interconnections suitable for an integrated circuit.

With closer spacing and higher speeds, parasitic capacitance between interconnections becomes a problem. When parasitic capacitance increases, the product of resistance and capacitance (RC) increases, which determines a time delay in circuit switching. Also, power consumption increases, and noise caused by mutual interference is generated, so that the device may be prevented from operating at high speed. Therefore, an insulating material having a low dielectric constant value (low-k), no more than 3, for example, a porous oxide, is used as an interlayer dielectric layer.

In fabricating interconnections using copper and low-k insulating material, the poor etchability of copper makes a dual damascene process a favorable solution. The dual damascene process has four methodological variations using 0.13 µm design rules, categorized as buried via, via first, trench first, and self aligned processes.

Increasing the speed of CMOS logic devices mainly depends on reducing gate delay time caused by reduction in a gate road. However, the speed of the device depends on RC delays caused by back end of line (BEOL) metallization in highly integrated devices.

In order to reduce the RC delay, low resistivity copper is used to form the metal interconnection (reducing resistance), and the interlayer dielectric layer is formed by using a low-k dielectric material (reducing capacitance), and then dual damascene process is adopted.

FIGS. 1A to 1E are sectional views illustrating a method of forming a related dual damascene pattern.

Referring to FIG. 1A, a first insulating layer 100 and a first conductive layer 102 is formed over a semiconductor substrate (not shown), which has undergone a conventional semiconductor manufacturing process. A second insulating layer 104 is deposited and the resultant structure is coated with a first photoresist 106 for a photolithography process. FSG or P—$SiH_4$ oxide, for example, can be used as the second insulating layer 104.

In FIG. 1B, a first photoresist pattern, that is, a via hole photoresist pattern 106' is formed over the resultant structure of FIG. 1A through a photolithography process. The second insulating layer 104 is etched using the via hole photoresist pattern 106' as a mask to form a via hole 108.

Then, in FIG. 1C, after removing the via hole photoresist pattern 106 of FIG. 1B, the resultant structure is coated with a second photoresist (not shown) and a photolithography process is performed on the second photoresist to form a second photoresist pattern 110. Then, the second insulating layer 104 is etched using the second photoresist pattern 110 as a mask to form a trench 112.

In FIG. 1D, the second photoresist pattern 110 patterned over the resultant structure of FIG. 1C is removed and a second conductive layer 114 is deposited over the resultant structure to fill the via hole and the trench 112. Copper, including a barrier metal layer, can be applied as the second conductive layer 114.

Finally, in FIG. 1E, a chemical mechanical polishing (CMP) process is performed so to planarize the second conductive layer 114, leaving copper only in the via hole 108 and the trench 112 to form a via contact unit 116 and an interconnection unit 118.

According to a related dual damascene process, in order to reduce resistance, a copper interconnection is used. In particular, a low dielectric constant layer and the copper interconnection are combined to improve the performance of the device.

In a related semiconductor device, a repair fuse is provided to repair the interconnection. To keep the process simple, the metal layer used for the interconnection is shared with the fuse.

Therefore, in semiconductor devices that use copper interconnections, the copper may be used for the repair fuse as well as for the interconnection.

In devices where the repair fuse is formed of copper, it is possible to cut the repair fuse using laser light. After the cutting process, in order to test which memory cells are good, a bias voltage is applied to the cut part of the repair fuse.

Since the severed portion of the fuse is then exposed to the air, corrosion may be caused by moisture. The bias voltage and the insulated part caused by cutting can be connected. As a result, a device characteristic degrades so that semiconductor yield degrades.

SUMMARY

Embodiments relate to a method of forming a fuse region in a semiconductor damascene process. Corrosion of a severed portion is prevented in a repair fuse interconnection structure.

Embodiments relate to a method of forming a fuse region in a semiconductor damascene process in which a specific layer is formed to prevent corrosion and re-connection of a severed part of the fuse region in a semiconductor damascene pattern, thereby preventing malfunction and improving the reliability of the device.

Embodiments relate to a method of forming a fuse region in a semiconductor damascene process. A first conductive layer is formed over a substrate of a semiconductor device. An interlayer dielectric layer is deposited over the first conductive layer. A second conductive layer is buried in the interlayer dielectric layer by a dual damascene process to simultaneously form an interconnection region having at least one interconnect unit and a fuse region having at least one fuse. The resultant structure is coated with a passivation layer. The fuse is cut to form a severed portion. A selective metal layer is deposited over the severed portion.

The interlayer dielectric layer may have a dielectric constant no more than 3.0, and may include FSG or $SiO_2$. The first conductive layer and the second conductive layer may comprise copper. The first conductive layer and the second conductive layer may be pattern-buried using an electroless or an electrically conductive scheme. The cut part is a predetermined part of the second conductive layer and a passivation layer of the fuse region. The selective metal layer is deposited to completely cover the cut part of the second conductive layer and may include at least one selected from the group consisting of W, Ti, TiN, Ta, and TaN. The selective metal layer is deposited within a predetermined time in an in-situ process after performing the fuse region cutting process. The dual damascene process may include performing a polishing process so that the second conductive layer remains only in a via hole and a trench.

DETAILED DESCRIPTION

Embodiments relate to depositing a metal layer over the cut part of a fuse region of a semiconductor damascene pattern to prevent the cut part from being exposed to the outside.

Figure 1A:
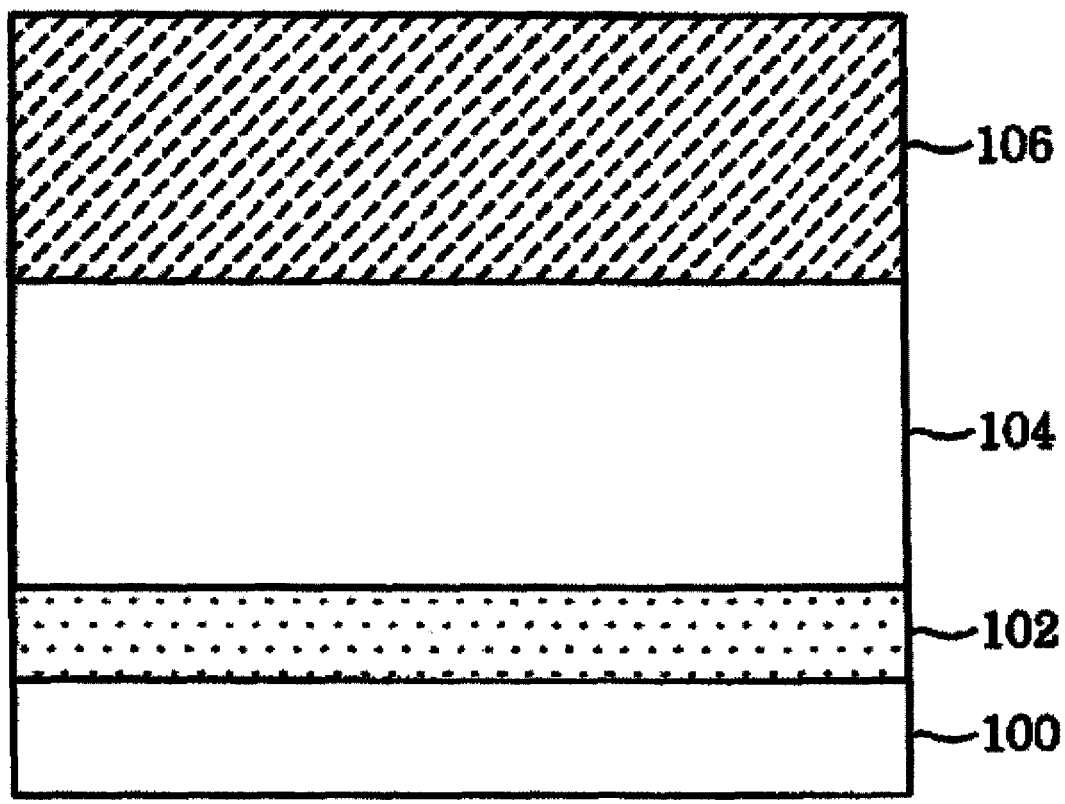
FIGS. 1A to 1E are sectional views of a device for explaining a method of forming a related dual damascene pattern; and Example
Figure 1B:
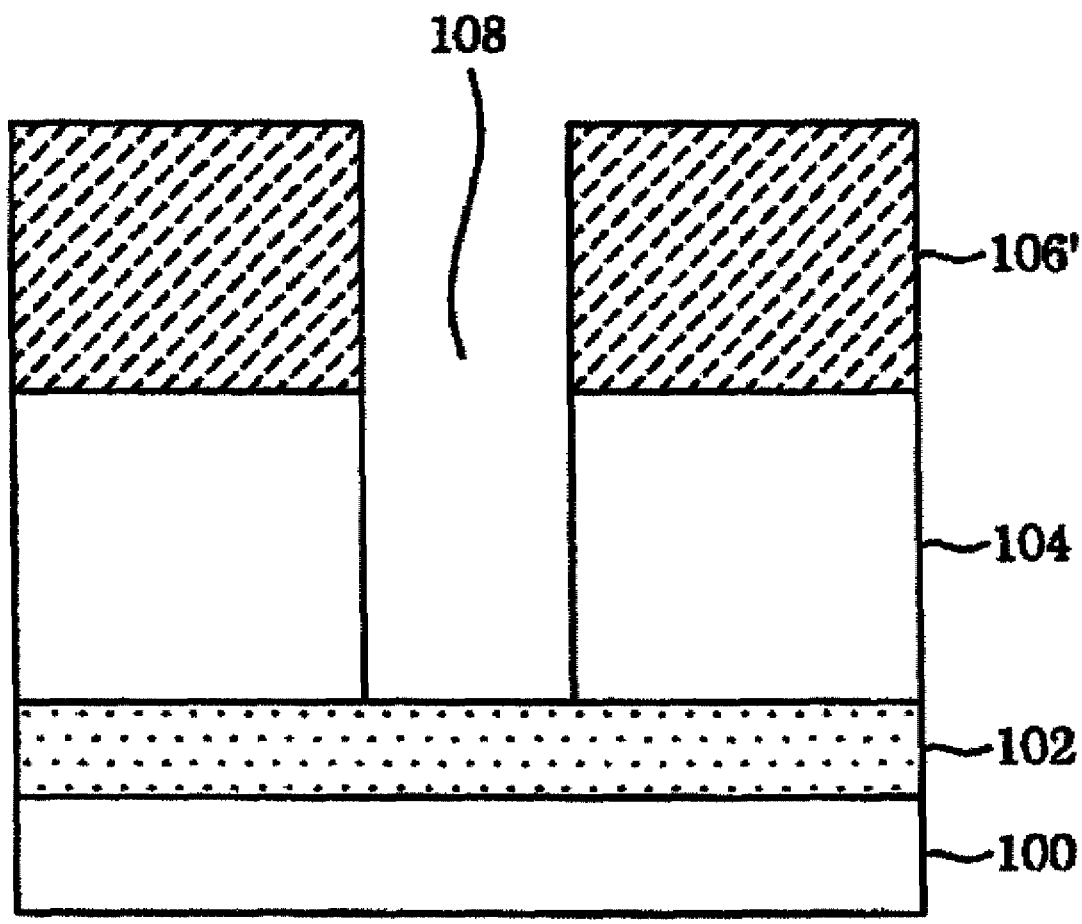
Figure 1C:
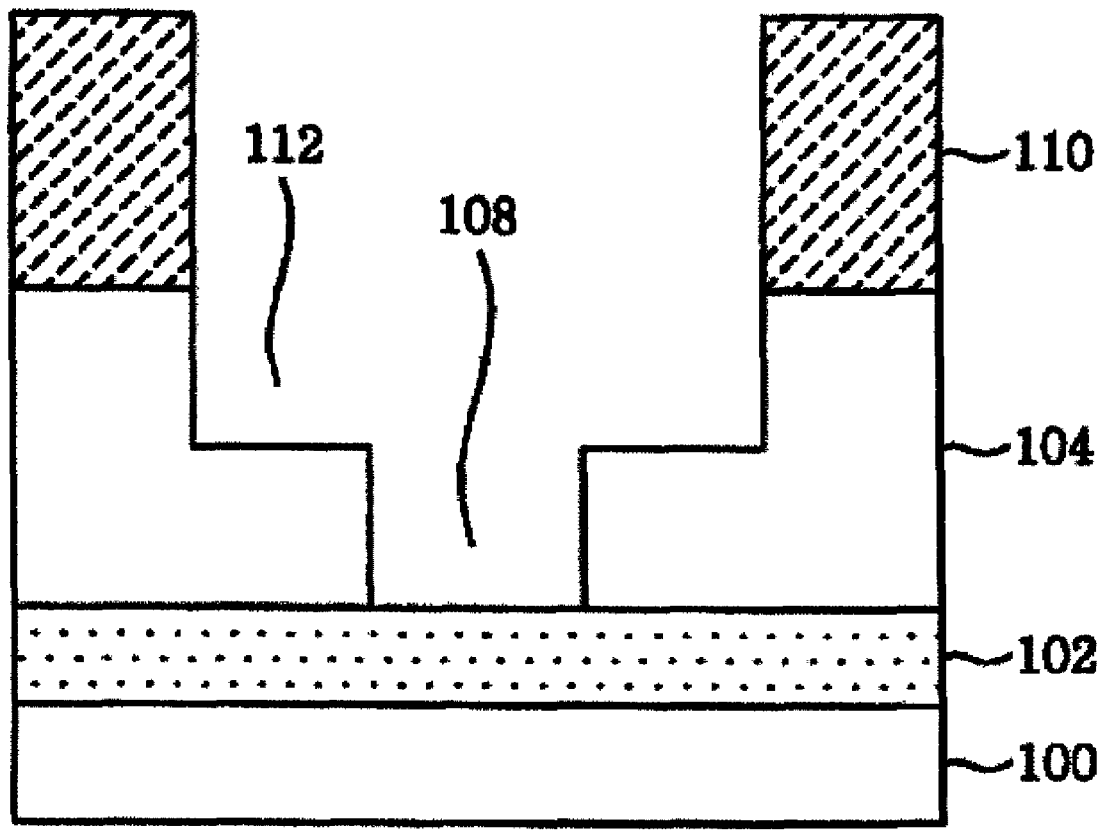
Figure 1D:
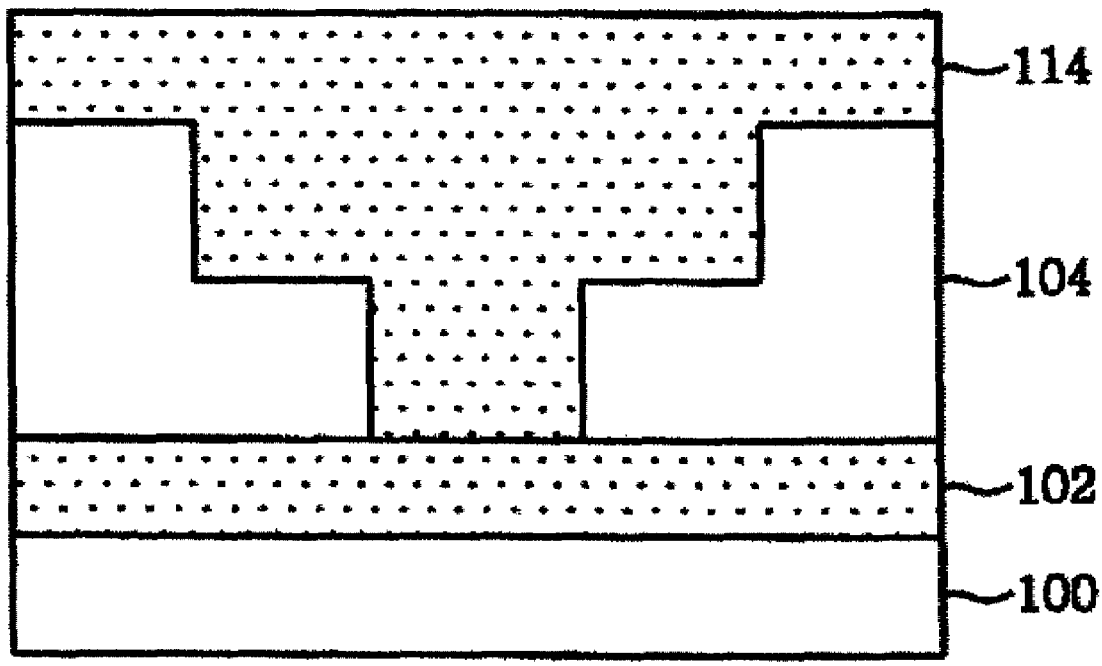
Figure 1E:
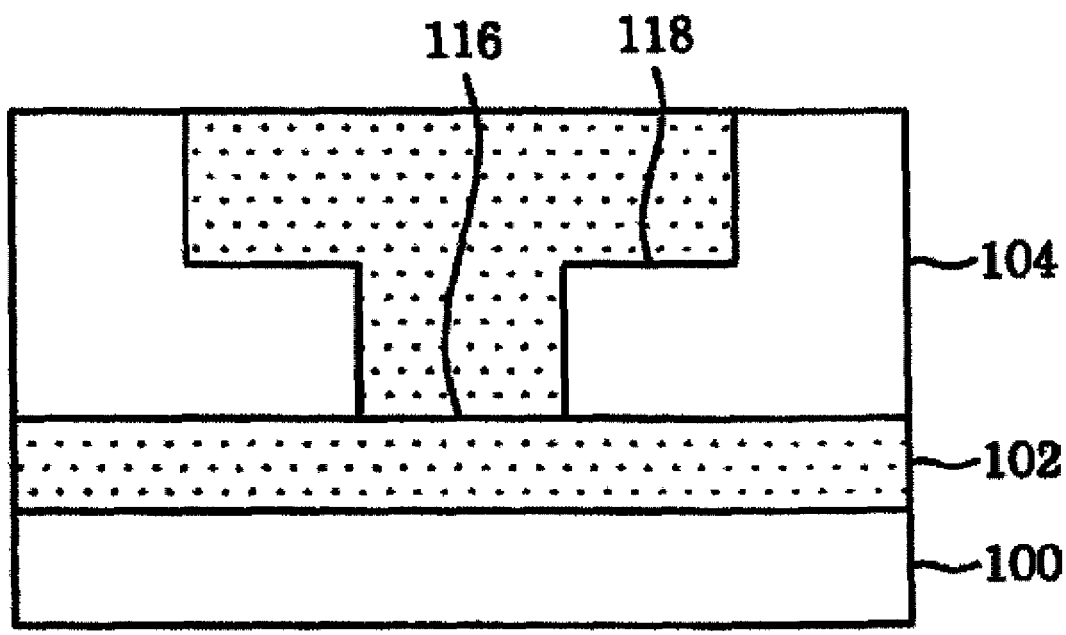
Figure 2:
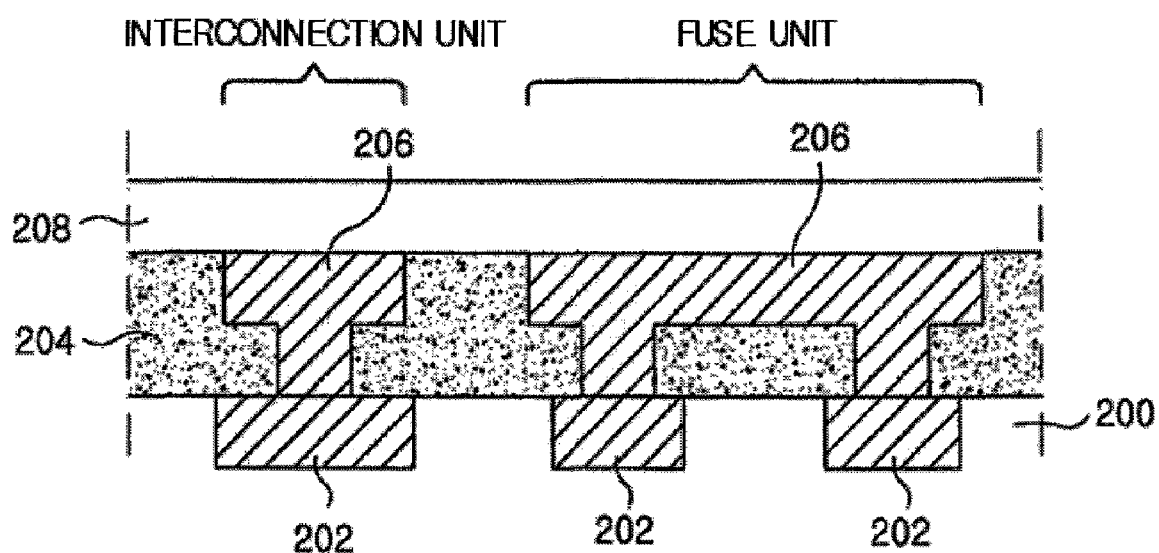
FIGS. 2 to 4 are sectional views of a device for describing a method of forming a fuse region in a semiconductor damascene process according to embodiments.
Figure 3:
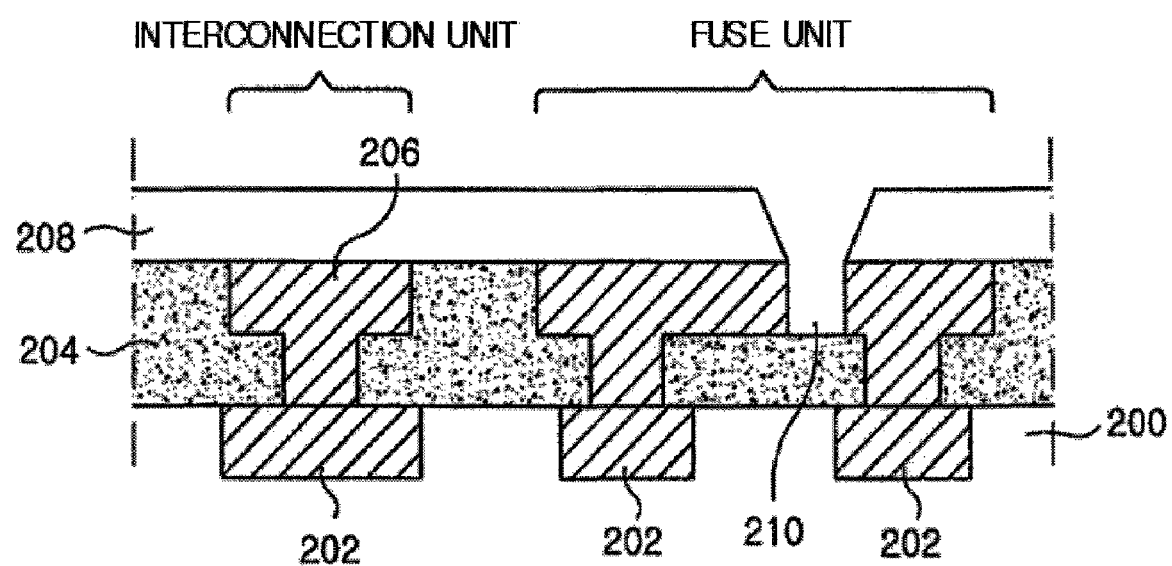
Figure 4:
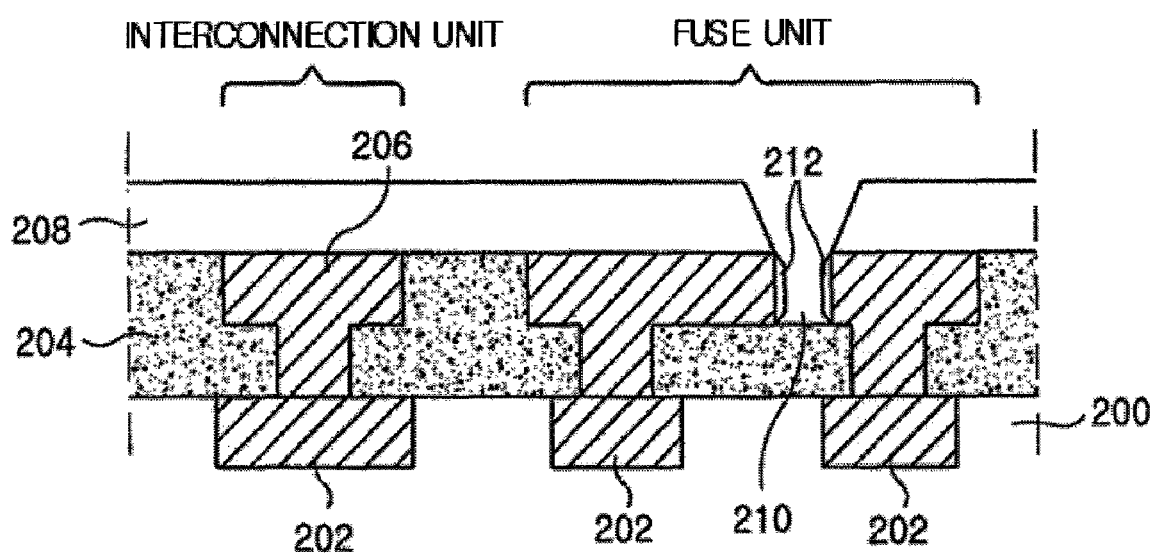

FIGS. 2 to 4 are sectional views of a device for describing a method of forming a fuse region in a semiconductor damascene process according to embodiments.

Referring to FIG. 2, a first insulating layer (not shown) and a first conductive layer 202, for example, a copper metal interconnection, are formed over a semiconductor substrate 200. Other elements and devices (not shown) have previously been formed on substrate 200. A second insulating layer 204 is deposited over the structure. The second insulating layer 204 has a dielectric constant no higher than a predetermined value, for example, 3.0. The insulating layer 204 may be formed of FSG or $SiO_2$.

A via hole photoresist pattern is formed over the resultant structure through the photolithography process. The second insulating layer 204 is etched using the via hole photoresist pattern as a mask to form a via hole.

After that, the via hole photoresist pattern is removed. A trench photoresist pattern is formed over the resultant structure through the photolithography process. The second insulating layer 204 is etched a second time using the trench photoresist pattern as a mask to form a trench.

Then, the patterned second photoresist pattern is removed. A second conductive layer 206 is deposited over the resultant structure to fill the via hole and the trench. The second conductive layer 206 may be formed of copper over a barrier metal layer as described above. The first and second conductive layers 202 and 206 can be deposited or pattern buried by an electroless of electrical conductive method.

Since the same patterning and etching processes in the related semiconductor dual damascene process are applied to the above patterning and etching process, that is, since the above patterning and etching process may be understood by a person skilled in the art, according to embodiments, in order to avoid redundancy in description, reference numerals and detailed forming processes are omitted.

The second conductive layer 206 is planarized by a chemical mechanical polishing (CMP) process so that the second conductive layer 206 remains only in the via hole and the trench to form a via contact unit and an interconnection unit. Then, a passivation layer 208 is formed. As illustrated in FIG. 2, a common interconnection layer used in a chip and a fuse region including the repair fuse are simultaneously formed by the dual damascene process using copper.

Then, in FIG. 3, laser light is radiated onto the fuse region to cut through the passivation layer and the repair fuse. Reference numeral 210 denotes the severed portion.

As described above, since the cut part 210 is exposed to room temperature and atmosphere. When as bias voltage is applied to the cut part 210, or when the cut part 210 is exposed for a long time, the cut part 210 may become corroded. Also, moisture penetrates the second conductive layer 206 through the cut part 210 so that a critical fault may be caused in the device.

FIG. 4 is a sectional view of a process of solving the problem.

As illustrated in FIG. 4, a selective metal layer 212 is deposited in accordance with embodiments to overlap the entire region of the cut part 210 of the second conductive layer 206. The selective metal layer 212 can be formed of at least one of W, Ti, TiN, Ta, and TaN.

At this time, the selective metal layer 212 can be deposited within a predetermined time, for example, 9 hours using an in-situ process performed on the portion of the second conductive layer 206 exposed after performing the fuse region cutting process of FIG. 3.

As described above, in the second conductive layer 206 on which the selective metal layer 212 is deposited, the severed portion 210 is not corroded so that it is possible to prevent the severed portion 210 from being corroded and to prevent moisture from being absorbed into the structure through the second conductive layer 206, even though a bias voltage may be applied to the cut part 210 or the cut part 210 may be exposed for a long time.

According to embodiments, since the selective metal layer is deposited over the cut part of the fuse region formed in a semiconductor damascene process, when a bias voltage is applied to the cut part or the cut part is exposed for a long time, it is possible to prevent the cut part from being corroded. It is also possible to prevent moisture from being absorbed into the second conductive layer and to thus improve the device characteristic. As a result, according to embodiments, the semiconductor device characteristics and yield are improved, so that high reliability is provided in the semiconductor manufacturing processes.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
    forming a first conductive layer over a substrate of a semiconductor device;
    depositing an interlayer dielectric layer over the first conductive layer;
    burying a second conductive layer in the interlayer dielectric layer by a dual damascene process to simultaneously form an interconnection region having at least one interconnect unit and a fuse region having at least one fuse;
    coating the resultant structure with a passivation layer;
    cutting the fuse to form a severed portion; and
    depositing a selective metal layer over the severed portion.

2. The method of claim 1, wherein the interlayer dielectric layer has a dielectric constant no more than 3.0.

3. The method of claim 1, wherein the interlayer dielectric layer includes fluorosilicate glass.

4. The method of claim 1, wherein the interlayer dielectric layer includes $SiO_2$.

5. The method of claim 1, wherein the first conductive layer and the second conductive layer comprise copper.

6. The method of claim 1, wherein the first conductive layer and the second conductive layer are pattern-buried using an electroless scheme.

7. The method of claim 1, wherein the first conductive layer and the second conductive layer are pattern-buried through an electrically conductive scheme.

8. The method of claim 1, wherein the second conductive layer in the interconnection region and the second conductive region in the fuse region comprise copper.

9. The method of claim 1, wherein the severed portion is a predetermined part of the second conductive layer and a passivation layer of the fuse region.

10. The method of claim 1, wherein the selective metal layer is deposited to completely cover the severed portion of the second conductive layer.

11. The method of claim 1, wherein the selective metal layer includes at least one selected from the group consisting of W, Ti, TiN, Ta, and TaN.

12. The method of claim 1, wherein the selective metal layer is deposited within a predetermined time in an in-situ process after performing the fuse region cutting process.

13. The method of claim 1, wherein the dual damascene process comprises performing a polishing process so that the second conductive layer remains only in a via hole and a trench.

* * * * *